United States Patent [19]

Nakata

[11] 4,127,792
[45] Nov. 28, 1978

[54] LUMINESCENT SEMICONDUCTOR DISPLAY DEVICE INCLUDING GATE CONTROL ELECTRODES

[75] Inventor: Jōsuke Nakata, Itami, Japan

[73] Assignee: Mitsubishi Denki Kabushiki Kaisha, Tokyo, Japan

[21] Appl. No.: 801,403

[22] Filed: May 27, 1977

[30] Foreign Application Priority Data

Jun. 1, 1976 [JP] Japan .................................. 51-64863

[51] Int. Cl.² ...................... H05B 33/16; H01L 33/00
[52] U.S. Cl. .................... 313/500; 313/501; 357/17
[58] Field of Search ................... 313/500, 501; 357/17

[56] References Cited

U.S. PATENT DOCUMENTS

| | | | |
|---|---|---|---|
| 3,508,111 | 4/1970 | Davidson et al. | 313/500 X |
| 3,763,405 | 10/1973 | Mitsuhata | 313/501 X |

Primary Examiner—Palmer C. Demeo

[57] ABSTRACT

A monolithic semiconductor luminescent display device has $p^+$ layers disposed in seven rows and five columns on one of the main faces of an $n$ substrate to form discrete luminescent junctions between them, five anodes disposed on the $p^+$ layers one for each column and provided with light emitting windows above the junctions, and a cathode disposed on the other main face of the substrate. Seven $p^+$ control bands extend through the substrate along the rows respectively and include current passageways below the junctions. The passageways have cross sectional areas controlled with reverse voltages applied to the $p^+$ bands through the gate electrodes respectively.

10 Claims, 19 Drawing Figures

|   | u | v | w | x | y |
|---|---|---|---|---|---|
| m | 50mu | 50mv | 50mw | 50mx | 50my |
| n | 50nu | 50nv | 50nw | 50nx | 50ny |
| p | 50pu | 50pv | 50pw | 50px | 50py |
| q | 50qu | 50qv | 50qw | 50qx | 50qy |
| r | 50ru | 50rv | 50rw | 50rx | 50ry |
| s | 50su | 50sv | 50sw | 50sx | 50sy |
| t | 50tu | 50tv | 50tw | 50tx | 50ty |

LUMINESCENT SEMICONDUCTOR DISPLAY DEVICE INCLUDING GATE CONTROL ELECTRODES

BACKGROUND OF THE INVENTION

This invention relates to improvements in a semiconductor luminescent display device having carrier injection electroluminescence.

There have been previously known semiconductor display devices of the type comprising a multiplicity of semiconductor display elements such as semiconductor luminescent diodes arranged in a matrix, each of the luminescent diodes including a *pn* junction through which a forward current flows to directly convert electrical energy to optical energy to display a figure or figures or a character or characters on the matrix. As compared with display devices employing discharge display tubes, fluorescent display tubes, incandescent filament display tubes, a plasma display panel, a cathode-ray tube, intrinsic electroluminescent display cells, or liquid crystal display elements, the above-mentioned type of semiconductor display devices have the following advantages:

(a) the voltage involved is low and, for example, of about one to three volts and the adaptability of semiconductor integrated circuits thereto is good;

(b) the response speed is high. For example, a rise time to luminescence ranges from $10^{-8}$ to $10^{-6}$ second;

(c) the reliability is high and the lifetime is on the order of from $10^5$ to $10^6$ hours;

(d) the devices are easy to make in small sizes and are light; and (e) the devices have high vibration and shock resistances and are mechanically strong.

Thus such devices have been thought to be desirable for the purpose of displaying figures or characters.

The greater number of semiconductor display devices employing semiconductor luminescent diodes are of the seven segment type for the purpose of displaying figures. For the purpose of displaying characters, devices have been developed and produced which have matrices including seven rows and five columns, but it is still difficult put them to practical use. Many problems remain unsolved in the manufacturing thereof and also in the development of driving circuits for the semiconductor display devices. Conventional figure display devices have been able to be relatively simply assembled because the number of semiconductor luminescent diodes involved is small and the diodes include a common cathode electrode resulting in a small number of external terminals. However, upon displaying characters and more particularly complicated characters and/or patterns, it has been required to arrange semiconductor luminescent diodes forming a display device in a matrix, to group anode and cathode electrodes of the diodes by rows and columns respectively and to interconnect the grouped anode and cathode electrodes on a common surface respectively. This has resulted in the disadvantages that the electrical insulation between the adjacent diodes and the wiring of the diodes becomes complicated and a degree of integration is difficult to achieved.

Accordingly it is a general object of the present invention to eliminate the disadvantages of the prior art devices as above described.

It is an object of the present invention to provide an improved semiconductor luminescent display device comprising a plurality of gate controlled field effect type semiconductor luminescent elements formed into a novel monolithic structure.

It is another object of the present invention to provide a novel monolithic structure of a semiconductor luminescent display device which is light in weight, and small in size yet which is easily manufactured.

It is still another object of the present invention to provide an improved semiconductor luminescent display device having a novel monolithic structure which is easily controlled and which has high reliability.

It is a further object of the present invention to provide an improved semiconductor luminescent display of a novel monolithic structure having a low consumption of electrical power and a long lifetime.

It is another object of the present invention to provide an improved semiconductor luminescent display device having a novel monolithic structure having an extremely high response speed.

SUMMARY OF THE INVENTION

The present invention provides a semiconductor luminescent display device comprising a semiconductor substrate of one type conductivity including a pair of opposite main faces, and a plurality of semiconductor layers of the other type conductivity descretely disposed on one of the opposite main faces of the semiconductor substrate to form discrete luminescent junctions therebetween, said plurality of semiconductor layers being arranged in a matrix including rows and columns. One first main electrode is disposed in ohmic contact with all the semiconductor layers arranged in each of the columns of the matrix and a second main electrode is disposed in ohmic contact with the other main face of the semiconductor substrate so that principal currents flow across said luminescent junctions between said first main electrodes and the cathode electrode respectively. A plurality of light emitting windows are provided in on the first electrodes or the second electrode at the luminescent junctions respectively thereby to emit light from the underlying luminescent junctions therethrough. A plurality of control semiconductor layers of the other type conductivity are disposed within the semiconductor substrate between the semiconductor layers arranged in the matrix and the second main electrode which extend continuously through the semiconductor substrate along the associated rows respectively and each of the control semiconductor layers has a plurality of passageways for the principal currents extending therethrough to lead to the luminescent junctions arranged in that row along which the same extends. One gate electrode is disposed in ohmic contact with each of the control semiconductor layers to supply a control voltage to the control semiconductor layer.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENT

Figure 1:
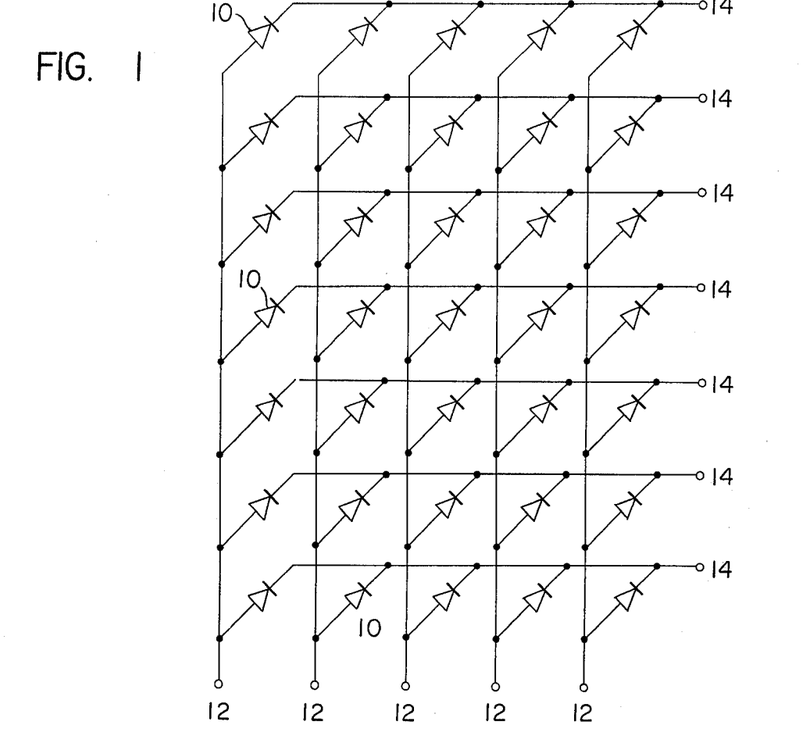
FIG. 1 is a wiring diagram of a conventional display device formed of a plurality of semiconductor luminescent diodes arranged in a matrix including seven rows and five columns.

Referring now to the drawings and FIG. 1 in particular, there is illustrated a conventional semiconductor luminescent display device including thirty-five semiconductor luminescent diodes arranged in a matrix having seven rows and five columns to selectively display alphabetic characters and figures as well as a limited number of kana or Japanese characters and symbols. The arrangement illustrated comprises a plurality, in this case, thirty-five semiconductor luminescent diodes 10 arranged in seven rows and five columns to form a matrix, five column leads 12 interconnecting anode electrodes of the diodes 50 disposed in the different columns respectively and seven row leads 14 interconnecting cathode electrodes of the diodes 50 disposed in the different rows respectively.

Figures 2, 3A, 3B:
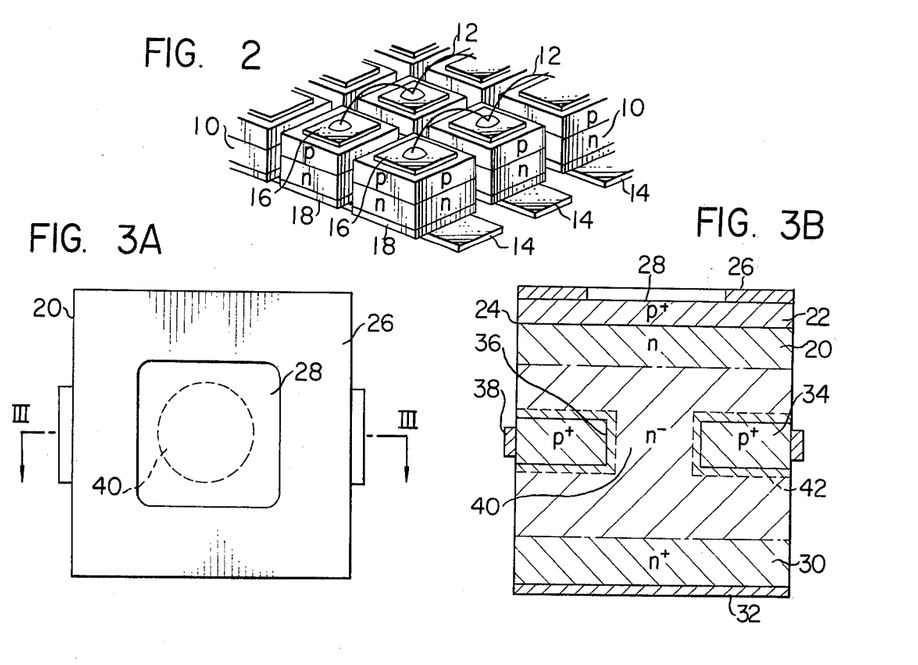
FIG. 2 is an enlarged perspective view of one portion of the arrangement shown in FIG. 1.
FIG. 3A is a plan view of a gate controlled field effect type semiconductor luminescent element used with the present invention.
FIG. 3B is a longitudinal sectional view taken along the line III — III of FIG. 3A.

As shown in FIG. 2, each of the diodes 50 includes a p type semiconductor layer and an n type semiconductor layer forming a pn junction therebetween, an anode electrode 16 disposed in ohmic contact with the p type layer and a cathode electrode 18 disposed in ohmic contact with the entire area of the n type layer. A column lead 12 is connected to the anode electrodes 16 of the diode 10 disposed in each column such as by brazing and a row lead 14 in the form of a strip is in intimate contact with the cathode electrodes of the diodes 10 disposed in each row.

In conventional matrix display devices having a plurality of semiconductor luminescent diodes assembled as above described, the turning off and brightness control of each diode 10 has necessarily been accomplished by an associated external circuit (not shown) through both a selected one of the column leads 12 and a selected one of the row leads or strips 14 resulting in a complicated external circuit. Also because a forward current through each diode 10 is directly controlled, it has been necessary to connect a control semiconductor element having a high capacity in a circuit provided therefor. In addition, each of the column leads 12 is required to have a current capacity sufficient to permit a high current to flow therethrough for the purpose of energizing each diode 10. Therefore such conventional display devices have been additionally disadvantageous in that the wiring is difficult.

Also it has been proposed to form a matrix display device of semiconductor luminescent diodes integrated in seven rows and five columns such as shown in FIG. 1 on the single semiconductor substrate so as to form a so-called monolithic structure. This measure has required not only interconnecting the anode electrodes of the diodes in each column or row and interconnecting the cathode electrodes thereof for each row or column and electrically insulating the rows and columns from one another but also to complicates the formation of pn luminescent junctions of the individual diodes, the disposal of electrodes on associated diodes, and the connection of those electrodes. Thus the conventional monolithic matrix display devices have been disadvantageous in that an increase in the number of the rows and columns of the display matrix causes not only an increase in the number of bonds and a decrease in the yield of the products but also a power loss owing to the wiring and a reduction the area of the radiant surface takes place.

Referring now to FIGS. 3A and 3B, there is illustrated, by way of example, a gate controlled field effect type semiconductor luminescent element (which is called hereinafter a "controlled luminescent element") having a novel structure to be used in the semiconductor luminescent display device of the present invention. The arrangement illustrated comprises a semiconductor substrate 20 of one type conductivity formed of any suitable luminescent semiconductor such as gallium-arsenide (GaAs), gallium-arsenide-phosphide (GaAsP), gallium-aluminum phosphide (GaAlP), gallium-phosphide (GaP), indium-gallium phosphide (InGaP), gallium nitride (GaN) or the like. In the example illustrated the substrate 20 is of an n type.

As shown in FIG. 3B, a $p^+$ type semiconductor layer 22 is disposed on the n type substrate 20 to form a pn junction 24 therebetween. The pn junction 24 emits light in response to a forward current flowing therethrough. A first main electrode, in this case, an anode electrode 26 is disposed in ohmic contact with the $p^+$ type semiconductor layer 22 by suitably depositing any suitable electrically conductive material, for example, aluminum in a film upon the semiconductor layer 22. The anode electrode 26 is provided with a central square opening 28 to which the $p^+$ type semiconductor layer 22 is exposed and which serves as a light emitting window permitting light emitted from the pn luminescent junction 24 to be externally visible therethrough.

The n type substrate 20 includes a lower portion forming an $n^-$ type semiconductor region which is provided on the lower surface as viewed in FIG. 3B with an $n^+$ type semiconductor layer 30. A second main electrode or a cathode electrode 32 is disposed in ohmic contact with the $n^+$ type semiconductor layer 30. The cathode electrode 32 in the example illustrated is formed of an electrically conductive film including principally gold. The $n^+$ type semiconductor layer 30 is effective for decreasing the contact resistance between the cathode electrode 32 and the substrate 20 but it may be omitted, if desired.

As shown in FIG. 3B, an annular $p^+$ type semiconductor layer 34 is buried in the $n^-$ type semiconductor region of the substrate 20 substantially parallel to the $pn$ luminescent junction 24 and forms a $pn$ gate junction 36 between the $p^+$ type semiconductor layer 34 and the $n^-$ type semiconductor region. The annular $p^+$ type semiconductor 34 includes a lateral surface exposed to the lateral surface of the substrate 20 and has an annular gate electrode 38 disposed in ohmic contact therewith and it has a central opening 40 located directly below the light emitting window 28 to form a channel or a current passageway. The passageway is shown in FIG. 3A as being circular and responsive to a reverse bias applied to the $pn$ gate junction 36 to control the spread of a depletion layer encircled by the $p^+$ type semiconductor layer 34 thereby to control the forward current flowing through the passageway 40. Dotted line 42 designates the edge of the depletion layer capable of spreading dependent upon the magnitude of the voltage reversely applied across the gate and cathode electrodes 38 and 32 respectively.

From the foregoing it is seen that the controlled luminescent element 20 constructed as above described can utilize a change in spread of the depletion layer disposed around the $pn$ gate junction 36 to vary the cross sectional area of the current passageway 40 to control the forward current. By this means the radiant output from the luminescent junction 24 is controlled.

Figure 4A:
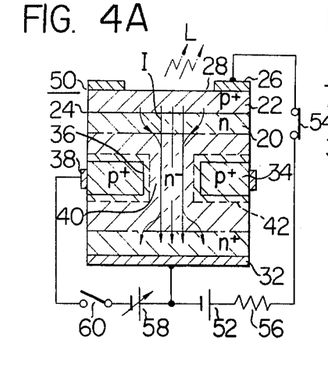
FIGS. 4A through 4C are longitudinal sectional views for explaining the operation of the semiconductor luminescent element shown in FIG. 3.

The operation of the controlled luminescent element as shown in FIGS. 3A and 3B will now be described with reference to FIGS. 4A–E, wherein like reference numerals designate the components identical to those illustrated in FIG. 3. As shown in FIG. 4A, the controlled luminescent element generally designated by the reference numeral 50 has the anode electrode connected to a positive side of a DC source 52 through a switch 54 and a protective resistor 56 and the cathode electrode 32 connected to the DC source 52 on the negative side. Also a variable source of gate direct current 58 includes a positive side connected to the cathode electrode of the controlled luminescent element 50 and a negative side connected to the gate electrode 38 thereof through a switch 60.

In FIG. 4A, the switches 54 and 60 are shown as being in the closed and open positions respectively. In these circumstances, only a low reverse voltage on the order of a diffusion potential is present around the $pn$ gate junction 36 and therefore the edge 42 of the depletion layer is spread only slightly so as to maintain the current passageway 40 for a forward current in the open state. Accordingly, a high forward current from the source 52 is permitted to flow through the resistor 56, the closed switch 54, the anode electrode 26, the current passageway 40 and the cathode electrode 32 and thence to the source 52. Thereby the controlled luminescent element 50 is put and maintained in its fully luminescent state in which a maximum quantity of light from the element 50 is emitted through the window 28 as shown in FIG. 4A. The forward current flowing through the element 50 is designated by the arrow I.

Figure 4B:
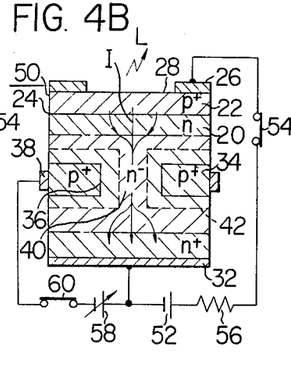

In FIG. 4B it is assumed that the switch 60 is first closed and then the switch 54 is closed after which the voltage from the gate current source 58 is slowly increased. Under the assumed condition, a reverse voltage is applied to the gate electrode 38 and is gradually increased to spread the edge 42 of the depletion layer formed around the gate junction 36 to the position shown by the dotted line 42 in FIG. 4B thereby to decrease the cross sectional area of the current passageway 40 and therefore the forward current I flowing therethrough. Thus the quantity of light emitted through the window 28 is reduced.

This means that, by controlling the reverse voltage applied to the gate electrode 36, the radiant output from the controlled luminescent element 50 can be adjusted. Since the control of the radiant output is accomplished by controlling the reverse voltage applied to the gate electrode 36, the radiant output can be controlled with a low power loss and by using a semiconductor element having a small current capacity.

Thus FIG. 4B shows the controlled luminescent element 50 emitting a controlled quantity of light through the light emitting window 28.

Figure 4C:
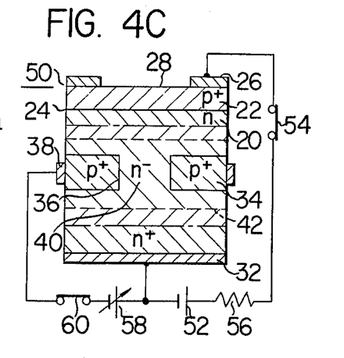

In FIG. 4C, the reverse voltage applied to the gate electrode 36 is further increased until the depletion layer is spreaded sufficiently to block the current passageway 40. Under these circumstances, the forward current I decreases to a magnitude determined by the space charge presented in the substrate 20 and the current path between the anode and cathode electrodes 26 and 32 respectively is interrupted resulting in the disappearence of light.

The reverse voltage across the gate and cathode electrodes 38 and 32 respectively for stopping the emission of light from the controlled luminescent element is called the "cutoff" voltage. This cutoff voltage is required to be less than the breakdown voltage for the $pn$ gate junction 36 resulting from the reverse voltage across the gate and cathode electrodes while at the same time it is required to preliminarily establish the cross sectional area of the current passageway 40 so that the edge 42 of the depletion layer can be spread sufficiently to block the passageway 40 at that cutoff voltage. If it is desired to make the cross sectional area of the current passageway 40 as large as possible then that portion of the $n$ type semiconductor layer forming the passageway preferably has an impurity concentration as low as possible so as to make the spread of the depletion layer large.

From the foregoing it is seen that the controlled luminescent element 50 includes a semiconductor luminescent diode and gate electrode 38 for controlling the radiant output from the diode with a reverse electric field produced by the application of a reverse voltage thereto. Thus the controlled luminescent element 50 has been designated by the symbol shown in FIG. 4D. Because of the control by the reverse field, the gate electrode 38 has a high in input impedance and it is possible to be directly driven by driving means of an MOS-IC structure.

Figure 4D:
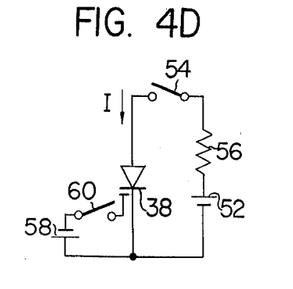
FIG. 4D is a schematic diagram of an electric circuit for operating the semiconductor luminescent element shown in FIG. 3.
Figure 4E:
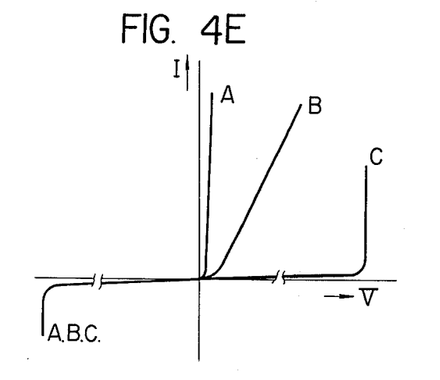
FIG. 4E is a graph illustrating characteristic curves for the semiconductor luminescent element shown in FIG. 3.

FIG. 4E shows the forward current I plotted on the ordinate against the anode voltage V on the abscissa by using, as the parameter, the reverse voltage applied to the gate electrode 38. The curve labelled A is for the arrangement as shown in FIG. 4A and indicates that, without a reverse voltage applied to the gate electrode, the application of a voltage across the anode and cathode electrodes immediately causes a sudden increase in forward current resulting in the emission of a maximum quantity of light.

Curve B is for the arrangement of FIG. 4B and indicates that the forward current I is linearly increased with the anode voltage V resulting in a controlled quantity of light emitted.

Curve C is for the arrangement shown in FIG. 4C and indicates that no forward current flows through the element 50 so that no light is emitted until the element is broken down by a high anode voltage.

The present invention seeks to provide a monolithic semiconductor luminescent display device comprising the required number of controlled luminescent elements such as above described formed on a single semiconductor substrate and arranged in a matrix.

While the present invention is applicable a matrix including any desired number of rows and any desired number of columns, the same will now be illustrated and described in conjunction with a matrix display including seven rows and five columns as in the arrangement of FIG. 1 only for purposes of illustration. Thus the matrix display can display alphabetic characters, figures and a limited number of symbols.

Figure 5A:
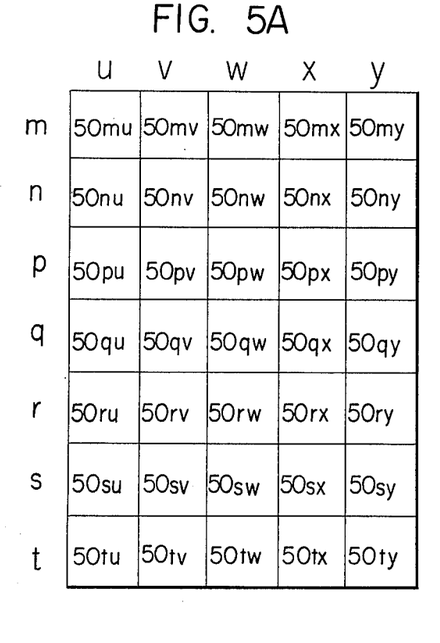
FIG. 5A is a diagram of a matrix in which gate controlled field effect type semiconductor luminescent elements forming a semiconductor luminescent display device are arranged.

Referring now to FIG. 5A, there is illustrated a fundamental configuration of the semiconductor luminescent display device of the present invention. In FIG. 5A a matrix is shown which has 35 controlled luminescent elements arranged in seven rows labelled $m, n, p, q, r, s$ and $t$ and five columns labelled $u, v, w, x$ and $y$. Each of the elements is designated by the same reference numeral 50 as the element shown in FIG. 3 and suffixed with the character identifying that row in which it is located, followed by the character identifying that column in which it is located. For example, 50$pw$ designates the controlled luminescent element 50 located in the row $p$ or the third row and in the column $w$ or the third column starting with the leftmost column. This is true in the case of corresponding components forming the controlled luminescent element in FIG. 5B et seq.

Figure 5B:
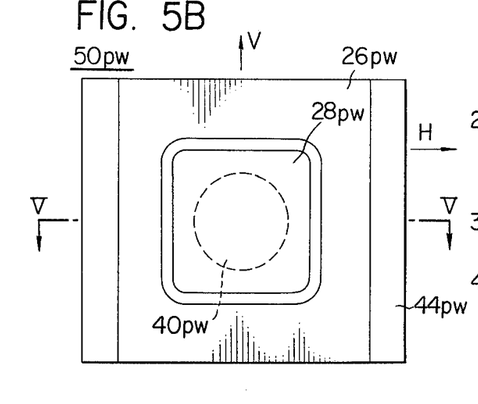
FIG. 5B is a plan view of one of the semiconductor elements shown in FIG. 5A.
Figure 5C:
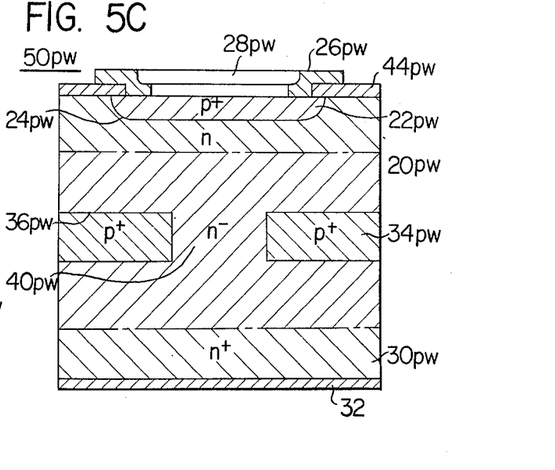
FIG. 5C is a longitudinal sectional view taken along the line V—V of FIG. 5B.

Because all the controlled luminescent elements are of the same construction, one of them, for example, the element 50$pw$ will now be described in conjunction with FIGS. 5B and 5C. FIG. 5B is a plan view of the element 50$pw$ and FIG. 5C is a longitudinal sectional view taken along the line V—V of FIG. 5B. The controlled luminescent element 50$pw$ is rectangular in shape having its longer sides extending in the direction of the row shown by the arrow H and includes the $p^+$ type semiconductor layer 22$pw$ centrally disposed in the $n$ type semiconductor substrate 20$pw$ to form therebetween the $pn$ luminescent junction 24$pw$ having an end exposed at the upper main face as viewed in FIG. 5C of the substrate 20$pw$. The $p^+$ type semiconductor layer 22$pw$ is formed, for example, by a selective diffusion technique.

An electrically insulating film 44$pw$ is disposed on the upper main face of the substrate 20$pw$ having a central square opening but covering the exposed end of the $pn$ luminescent junction 24$pw$. The anode electrode 26$pw$ formed of a rectangular electrically conductive film is disposed on the insulating film 44$pw$ and also in ohmic contact with the $p^+$ type semiconductor layer 22$pw$. The anode electrode 26$pw$ includes a central square opening serving as the light emitting window 28$pw$ the same as the anode electrode 28 shown in FIGS. 3A and 3B and leaves portions of the insulating film 44$pw$ exposed on both sides extending in the direction of the column as shown by the arrow V.

Figures 5D, 5E:
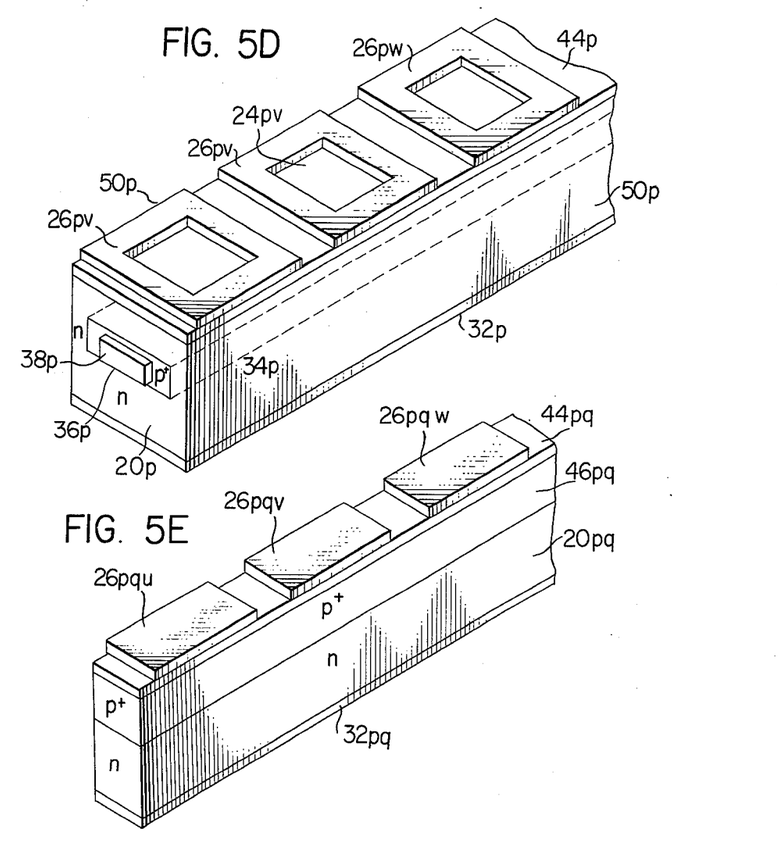
FIG. 5D is a fragmental perspective view of one row array of the semiconductor luminescent elements shematically shown in FIG. 5A.
FIG. 5E is a fragmental perspective view of a spacer block interposed between each pair of adjacent row arrays.

The $p^+$ type control semiconductor layer 34$pw$ shown in FIG. 5C is not in the form of an annulus but in the form of a strip buried in and traversing the $n^-$ type semiconductor layer of the subtrate 20$pw$ in the direction of the row shown by the arrow H and substantially parallel to the main faces of the substrate 20$pw$. The control semiconductor layer 34$pw$ is provided on that portion thereof located directly below the window 28$pw$ on the anode electrode 26$pw$ with a circular opening filled with the $n^-$ type semiconductor layer of the substrate 20$pw$ to form the current passageway 40$pw$ in the form of a circular cylinder for the forward current. The $p^+$ type control semiconductor layer 34$pw$ has a width less than that of the element in the direction of the column as shown in FIG. 5D.

In other respects the arrangement shown in FIGS. 5B and 5C is substantially identical to that shown in FIGS. 3A and 3B.

It is to be noted that the cross sectional profile of the current passageway 40$pw$ is not limited to a circle and that it may have any desired profile as long as the edge 42 (not shown) of the depletion layer can be spread by a cutoff voltage for the controlled luminescent element sufficiently to block the current passageway. Also as above described in conjunction with FIG. 3, that portion of the semiconductor layer disposed around the $p^+$ type control semiconductor layer 34$pw$ and more particularly forming the current passageway 40$pw$ preferably has a low impurity concentration to permit the cutoff voltage to spread the edge of the depletion layer easily.

As seen in FIG. 5A, a plurality, in this case five, controlled luminescent elements identical to the element 50$pw$ are tandem connected in the direction of the row to form a row array of controlled luminescent elements. For example, the elements 50$pu$, 50$pv$, 50$pw$, 50$px$ and 50$py$ are connected in a tandem manner to form a row array of the elements generally designated by the reference numeral and character 50$p$. In general any row array of controlled luminescent elements is designated by the reference numeral 50 suffixed with the reference character identifying that row to which those elements belong.

FIG. 5D is a fragmental perspective view of the row array of the controlled luminescent element 50$p$ thus formed. As seen in FIG. 5D, the identical components disposed in the respective elements and contacted by one another are connected into individual unitary structures. More specifically, the $p^+$ type control semiconductor layers traversing the respective elements are connected together into a $p^+$ type control semiconductor band 34$p$ having a unitary structure within a single $n$ type semiconductor substrate 20$p$ to form a $pn$ gate junction 36$p$ between the same and an $n^-$ type semiconductor region of the substrate common to the row array 50$p$. The control band 34$p$ includes one opening directly below each of the light emitting windows such as shown at 28$pv$ in FIG. 5D providing one passageway such as shown at 40$pw$ in FIG. 5C for a forward current. The control band 34$p$ is exposed at one end to one of the two lateral end surfaces of the row array 50$p$ and a common gate electrode 38$p$ is disposed in ohmic contact with the exposed end of the band 34$p$.

Further the insulating films on the individual elements are connected together into a single insulating film 44$p$ on which the anode electrodes 26$pu$, 26$pv$, 26$pw$, - - - are disposed in spaced relationship on the film 44p and also in ohmic contact with the discrete, $p^+$ type semiconductor layers such as the layer 22pw (see FIG. 5C). However the respective cathode electrodes are connected together into a single cathode electrode 32p.

The remaining row arrays of the controlled luminescent elements are identical to the row array 50p and include components identical to those disposed in the row array 50p to be connected into respective unitary structures and designated by the specified reference numerals therefor suffixed with the reference character identifying that row in which the components are disposed.

In the arrangement of FIG. 5D, a reverse voltage is applied to the gate electrode 38p to simultaneously control forward currents through the respective current passageways between the respective anode electrodes 26pu, 26pv, 26pw, - - - and the common cathode electrode 32p. The passageways are electrically isolated from one another by the depletion layers formed in the $n^-$ type semiconductor layer of the single substrate 20p due to the control by the reverse voltage as above described in conjunction with FIGS. 3A and 3B.

The row arrays of controlled luminescent elements 50m, 50n, 50p, - - - 50t including their own $p^+$ type control semiconductor bands 34m, 34n, 34p, - - - 34t are arranged in the direction of the column resulting in a semiconductor luminescent display device. In this case, it is necessary to prevent crosstalk from occurring between each pair of adjacent row arrays of controlled luminescent elements. That is, it is required to prevent the control of the light emitted from the controlled luminescent elements of each row array for example, the row array 50p from being effected by an associated control semiconductor band or the band 34p from affecting the controlled luminescent elements of the adjacent row array or the row array 50q.

FIG. 5E shows, by way of example, one portion of a spacer block disposed between the adjacent row arrays 20p and 20q to prevent the occurrence of crosstalk therebetween. In FIG. 5E the reference characters pq following the reference numeral designate a component interposed between those identical components adjacent to each other and identified by that reference numeral. For example, 44pq designates an electrically insulating film interposed between the insulating films 44p (see FIG. 5D) and 44q (not shown).

The arrangement illustrated comprises an n type semiconductor layer 20pq, a $p^+$ type spacer layer 46pq disposed on the n type semiconductor layer 20pq, and an electrically insulating film 44pq disposed on the spacer layer 46pq. A metallic sheet 32pq is disposed in ohmic contact with the n type semiconductor layer 20pq and a plurality of, in this case five, metallic sheets 26pqu, 26pqu, 26pqw, - - - are disposed on the insulating film 44pq at such positions that, when interposed between the two adjacent row arrays 20p and 20q, the metallic sheets are aligned with the adjacent anode electrodes and are contacted by them. With the spacer block interposed between the row arrays 20p and 20q, the $p^+$ type spacer layer 46pq is located between the $p^+$ type control semiconductor band 34p (see FIG. 5D) and 34q (not shown) to space them from each other.

In order to prevent the $p^+$ type control semiconductor band 34p from causing crosstalk between the row arrays 20p and 20q of controlled luminescent elements, an edge 42q (not shown) of a depletion layer formed around the $p^+$ type control semiconductor band 34q with a cutoff voltage for that $p^+$ type control band 34q can be spread to directly contact the $p^+$ type spacer layer 46pq. Alternatively, a reverse voltage may be applied across the $p^+$ type spacer layer 46pq to cause an edge (not shown) of a depletion layer formed therearound at that reverse voltage to contact the edge 11q (not shown) of the depletion layer formed around the $p^+$ type control semiconductor band 34q at the cutoff voltage therefor.

It will readily be understood that a spacer block identical to that shown in FIG. 5D is interposed between each pair of adjacent row arrays of controlled luminescent elements to prevent the occurrence of crosstalk therebetween.

From the foregoing it can readily be understood that the monolithic semiconductor luminescent delay device of the present invention can be formed by arranging a first plurality, in this case, five of the controlled luminescent elements 50 in each of a second plurality of, in this case seven, rows according to the matrix of FIG. 5A to form the second plurality of row arrays 50m, 50n - - - 50t and interposing a spacer block as shown in FIG. 5D between each pair of adjacent row arrays while disposing identical components forming the respective elements and contracted by one another into individual unitary structures on a single semiconductor substrate.

As will readily be understood from the illustration of FIGS. 5D and 5E, the semiconductor luminescent display device comprises a plurality of discrete luminescent junctions 24 formed adjacent one of the opposite main faces of the substrate 20 arranged in a second plurality, or seven, rows and a first plurality, or five, columns, the first plurality of anode electrodes 26u, 26v, - - - 26y being electrically insulated in the direction of the column from one another by a common electrically insulating film 44 to supply forward currents to the second plurality of luminescent junctions 24u, 24v - - - 24y, arranged in the direction of the column respectively, the second plurality of $p^+$ type control semiconductor bands 34m, 34n, - - - 34t burried in the substrate 20 being spaced from one another by $p^+$ type semiconductor spacer layers 46mn, 46np, - - - 46st so as to be capable of controlling respective forward currents flowing in the first plurality of luminescent junctions 24m, 24n, - - - 24t, arranged in the direction of the row, the second plurality of gate electrodes 38m, 38n, - - - 38t disposed in ohmic contact with the $p^+$ type control semiconductor bands 34m, 34n, - - - 34t respectively, and a common cathode electrode 32 disposed in ohmic contact with the other main face of the substrate 20. It will readily be understood that each of the anode electrodes 26u, 26v, - - - 26y are constituted by the individual electrodes of the respective elements interconnected by the metallic plates such as 26pqu (see FIG. 5E) on the spacer blocks interposed between pairs of the adjacent row arrays of the elements while the common cathode electrode 32 is formed of the cathode electrodes such as 32p (see FIG. 5D) on respective row arrays of the elements interconnected by the metallic sheet such as 32pq (see FIG. 5F) on the spacer blocks.

Figure 5F:
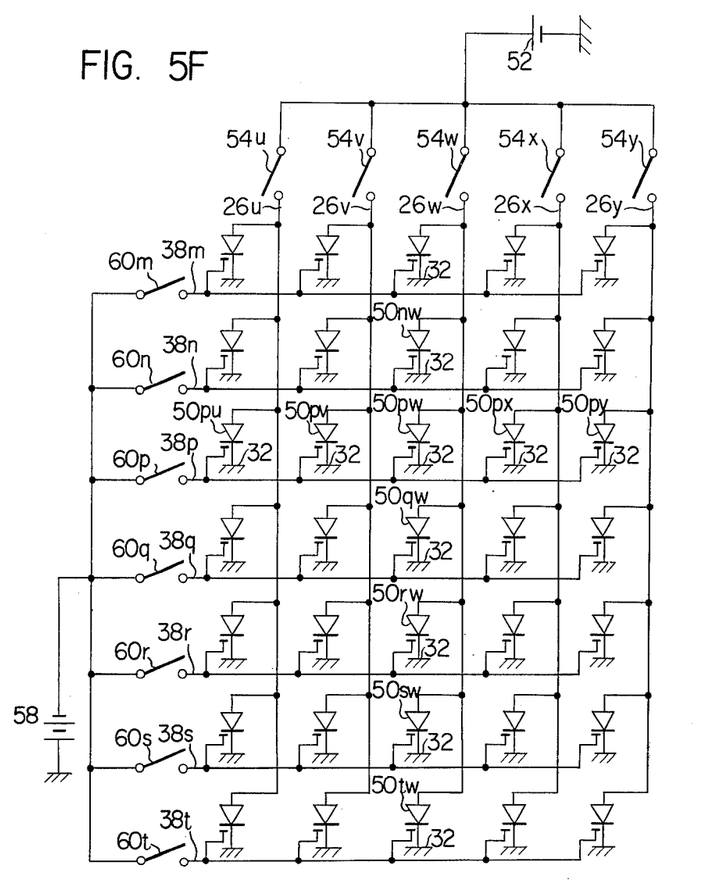
FIG. 5F is a schematic diagram of an equivalent circuit to the arrangement shown in FIG. 5A with a driving circuit therefor.

In order to operate the semiconductor luminescent display device, the anode electrodes 26u, 26v, - - - 26y are connected to the positive side of a DC source 52 through normally open column switches 54u, 54v, - - - 54y respectively and the common cathode electrode 32 is connected to the source 52 at the negative side connected to ground while the respective gate electrodes 36m, 36n, - - - 36t are connected to the negative side of a gate DC source 38 through normally open row switches 60m, 60n, - - - 60t respectively, as shown in FIG. 5F wherein the controlled luminescent elements are denoted by the symbol therefor as shown in FIG. 4D.

In order to emit light from one of the controlled luminescent elements, for example, the element 50pw, the gate source 58 is first set to supply a reverse voltage higher than the cutoff voltages for all the elements 50 and then all the row switches 60m, 60n, - - - 60t are put in their clossed positions. This permits the reverse voltage to be applied to the gate electrodes 36m, 36n, - - - 36t to block the current passageways in all the elements by the edges of the depletion layers formed around the $p^+$ type control bands 34m, 34n, - - - 34t at the reverse voltage in the manner as above described in conjunction with FIG. 4C. Thus all the elements are prevented from emitting light.

Subsequently, a voltage, as required, across the source 52 is applied to the anode electrode 26w only in the column w by closing the associated column switch 54w and only the row switch 60p is turned off. The opening of the row switch 60p causes the current passageway 40w to be unblocked by the spread edge of the depletion layer around the mating $p^+$ type control band 34p resulting in the element 25pw emitting light. Any desired one or ones of the controlled luminescent elements can be called emit light in a similar manner.

The extinction of the lighted element or elements can be accomplished only by applying to all gate electrodes a reverse voltage higher than the cutoff voltages for all the elements. Also the radiant output or outputs from the element or elements can be controlled by controlling the voltages across both the source 52 and the gate source 58 as will readily be understood from the foregoing description in conjunction with FIGS. 4B and 4E.

Therefore it is seen that the semiconductor luminescent display device can display characters or pictures by connecting and disconnecting the anode source 52 to and from the anode electrodes in the respective columns by scanning pulses having sequences as required while connecting and disconnecting the gate source 58 to and from the gate electrodes in the individual rows by signal pulses as determined by the characters or pictures to be displayed in synchronization with the scanning pulses. In addition, by controlling the voltage applied to the gate electrodes simultaneously with the connection and disconnection of both sources so as to control the radiant outputs from the associated luminescent junctions, a picture having half tones can be displayed on the matrix of the device.

Figure 6A:
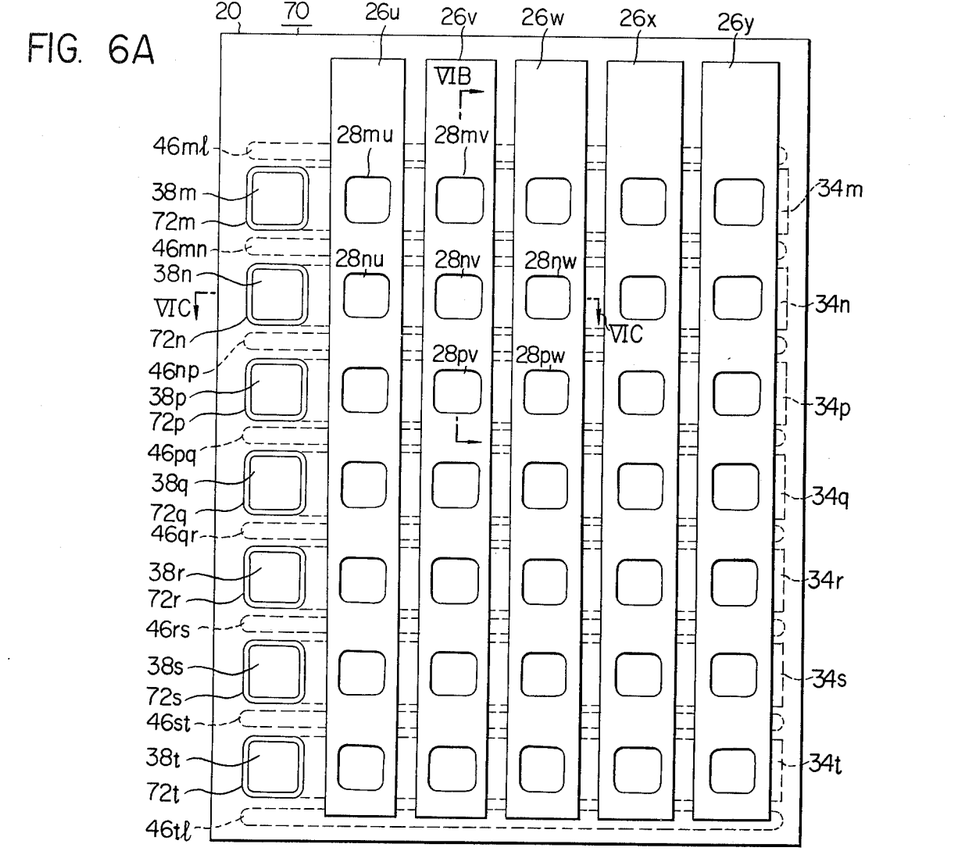
FIG. 6A is a plan view of one embodiment according to the monolithic semiconductor luminescent display device of the present invention.

Referring now to FIG. 6A–6D, wherein like reference numerals designate components identical to or corresponding to those shown in the preceding Figures, there is illustrated one embodiment of a monolithic semiconductor luminescent display device according to the present invention. FIG. 6A is a plan view of this embodiment. The semiconductor luminescent display device having a monolithic structure is generally designated by the reference numeral 70 and includes a front surface including a leftmost column as viewed in FIG. 6A having a plurality of, in this case seven, $p^+$ type semiconductor layers 72m, 72n, - - - 72t disposed at predetermined equal intervals to connect the gate electrodes 38m, 38n, - - - 38t to the $p^+$ type control layers 36m, 36n, - - - 36t, respectively. Those $p^+$ type connection layers can be formed by selectively diffusing a p type impurity into a semiconductor substrate from one of the opposite main faces, in this case, the upper main face. The arrangement also includes a plurality of, in this case five, longitudinal anode electrodes 26u, 26v, - - - 26y disposed at predetermined equal intervals to the right of the leftmost column. Each anode electrode includes seven light emitting windows disposed therein and transversely aligned with the individual $p^+$ type connection layers 72m, 72n, - - - 72t. For example, the anode electrode 26v includes seven windows 28mv, 28nv, - - -. Those windows are identical to the window 28pw shown in FIG. 5B and others. Thus the windows are arranged in a matrix including seven rows and five columns.

The arrangement further comprises $p^+$ type control semiconductor bands 34m, 34n, - - - 34t one for each row extending in the direction of the row as shown by dotted lines in FIG. 6A and a plurality of, in this case eight, spacer blocks 46ml, 46mn, 46np - - - 46st, 46tl. The spacer blocks 46mn, 46np - - - 46st are interposed between the $p^+$ type control bands 34m, 34n, - - - 34t, to prevent the occurrence of crosstalk between adjacent $p^+$ type control bands as above described in conjunction with FIG. 5E. The pair of the outermost spacer blocks 46ml and 46tl disposed on the outside of the uppermost and lowermost row arrays may be omitted, if desired.

The components shown in FIG. 6A have already been described in conjunction with FIG. 5 except for the $p^+$ type connection layers.

Figure 6B:
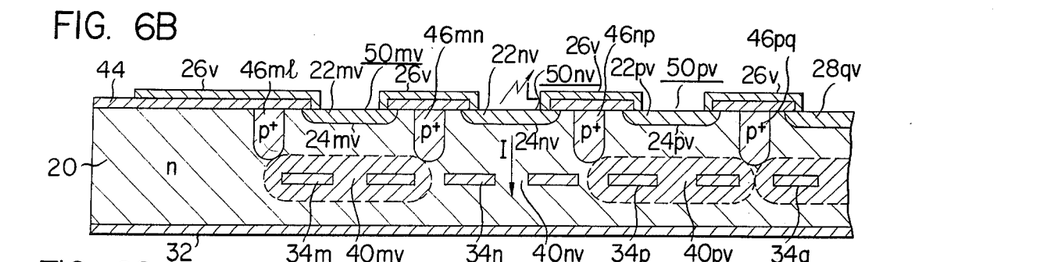
FIG. 6B is a longitudinal sectional view taken along the line VIB — VIB of FIG. 6A.
Figure 6C:
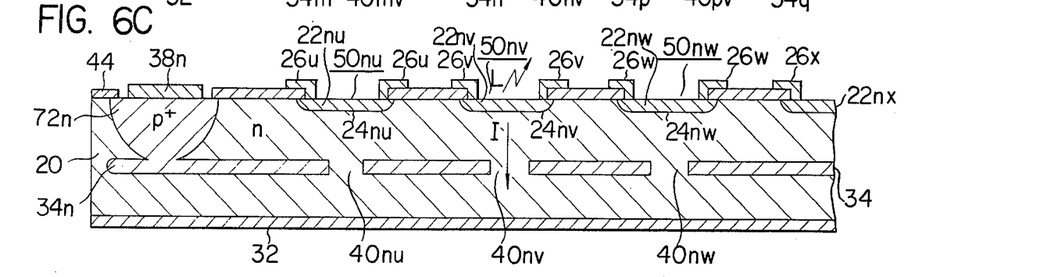
FIG. 6C is a longitudinal sectional view taken along the line VIC — VIC of FIG. 6A.

FIG. 6B and 6C are a longitudinal and a transverse sectional views taken along the lines VIB — VIB and VIC — VIC of FIG. 6A respectively.

In order to manufacture the semiconductor luminescent display device such as shown in FIGS. 6A, 6B and 6C, one first prepares a semiconductor substrate formed of a highly doped $N^+$ type monocrystalline gallium arsenide (GaAs). Successively grown on a crystallographic plane <100> of the substrate are an $n^-$ type epitaxial GaAs layer lightly doped with tellurium (Te) and an $n^-$ type epitaxial $GaAs_{1-x}P_x$ (where $0 \leq x \leq 1$) layer also lightly doped with tellurium from the vapor phase. In this case the epitaxial growth of $GaAs_{1-x}P_x$ is effected starting with $x = 0$ while $x$ is slowly increased to a value of about 0.4 in order to prevent the occurrence of internal strains due to a difference in lattice constant between the two grown crystals.

Then a double film formed of silicon nitride and silicon dioxide is disposed on the surface formed of $GaAs_{0.6}P_{0.4}$ of the $n^-$ type epitaxial layer and provided with windows in a predetermined pattern required for forming the $p^+$ type control layers and by photolithographic and etching techniques resulting in a diffusion mask, although the film and mask are not illustrated.

The assembly thus formed is sealed in a quartz tube under a vacuum with zinc (Zn) and arsenic (As). The quartz tube and its contents are heated to an elevated temperature sufficient to selectively diffuse the zinc into the GaAs — $GaAs_{1-x}P_x$ substrate through the diffusion windows to form $p^+$ type control bands such as the bands 34m, 34n, 34p, 34q, including current passageway 40mv, 40nv, 40pu - - - as shown in FIGS. 6B and 6C. Thereafter the assembly thus processed is taken out of the quartz tube and the double film is removed from the assembly.

Following this, an $n^-$ type $GaAs_{0.6}P_{0.4}$ layer lightly doped with tellurium (Te) and an $n^-$ type $GaAs_{0.6}P_{0.4}$ layer are epitaxially grown on the surface of the $n^-$ type $GaAs_{0.6}P_{0.4}$ layer including $p^+$ type control bands in succession from the vapor phase. The n type epitaxial layer has a somewhat higher impurity concentration than the $n^-$ type epitaxial layer.

Thus there is formed the $n$ type semiconductor substrate 20 including the $n^-$ type semiconductor layer and having the $p^+$ type control bands 34 buried therein with the $n^+$ type semiconductor layer 30 overlaid thereon.

Then a similar double film is grown on the $n$ type epitaxial GaAs$_{0.6}$P$_{0.4}$ layer from the vapor phase and provided with diffusion windows in a predetermined pattern required for disposing $p^+$ type gate connection layers 72 and $p^+$ type semiconductor spacer blocks 46 in the substrate 20 thus formed and in a similar manner to that above described. By using a diffusion mask thus prepared, zinc is again selectively diffused into the substrate 20 to form the $p^+$ type connection layers and spacer layers followed by the removal of the mask. The $p^+$ type gate connection layers are required to reach associated control bands as shown by the $p^+$ type connection layer 72$n$ reaching the $p^+$ type connection band 34$n$ in FIG. 6C.

Further a double film such as above described is disposed on the surface of the substrate 20 having the spacer blocks and connection layers exposed thereto and photolithographic and etching techniques are similarly used to provide on the double film diffusion windows in a predetermined pattern required for forming $p^+$ type semiconductor layers 22. Thereafter zinc is similarly diffused into the substrate 20 to provide $p^+$ type semiconductor layers therein to form $pn$ luminescent junctions between the same and the $n$ type GaAs$_{0.6}$P$_{0.4}$ layer (see, for example, the $p^+$ type layer 22$mv$ and the junction 24$mv$ in FIG. 6B).

After the formation of the $p^+$ type semiconductor layers 22, the exposed surface of the $n^+$ type GaAs substrate first prepared is reduced to a predetermined thickness by lapping.

A film 44 of any suitable electrically insulating material is suitably disposed on the upper surface as viewed in FIGS. 6B and 6C of the substrate 20 and provided with light emitting windows such as window 28$mv$ (see FIG. 6B) in the form of squares upon the respective $p^+$ type semiconductor layers such as 22$mv$ (see FIG. 6B) and openings upon the respective exposed end faces of the $p^+$ type control layers in a manner well known in the art and the film covers all the ends of all the $pn$ junctions exposed at the upper surface of the substrate.

Finally gold or aluminum including from 1 to 2% by weight of zinc is evaporated on the insulating film 44 and the exposed portions of the upper surface of the substrate 20 under a vacuum so as to be disposed in ohmic contact with the $p^+$ type semiconductor layer 22 and the $p^+$ type gate connection layers 72. Then photolithographic and etching techniques are used to form five strip-shaped electrodes 26$u$, 26$v$, - - - 26$v$ with the light emitting windows such as the window 28$mu$ and seven gate electrodes 38$m$, 38$n$, - - - 38$t$, as shown in FIG. 6A. Further gold including from 1 to 5% by weight of germanium is evaporated on the entire area of the lower surface of the substrate first prepared under a vacuum to form a cathode electrode in ohmic contact therewith.

The semiconductor luminescent display device thus manufactured is suitably encapsuled for completion of the device.

If a plurality of semiconductor luminescent display devices have been formed on a single semiconductor substrate in the manner as above described, then they can be separated from one another by using an appropriate cutter after which the individual devices are separately encapsuled.

Figure 6D:
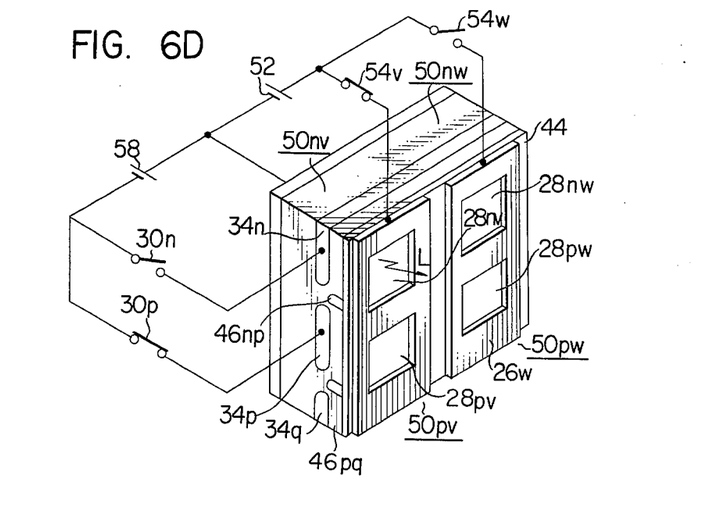
FIG. 6D is a fragmental perspective view of one portion of the arrangement shown in FIGS. 6A through 6C illustrating one of the semiconductor luminescent elements emitting light and an associated circuit.

FIG. 6D is a fragmental perspective view of a controlled luminescent element 50$nv$ emitting light with some of the associated components.

As above described in conjunction with FIG. 5A, the reverse voltage across the gate source 58 is increased to the cutoff voltage for all the controlled luminescent elements and then all the row switches are turned on and then only the column switch 54$v$ in the column $v$ is turned on. Thereafter the gate switch 60$n$ in the row $n$ is turned off to cause only the controlled luminescent element 50$nv$ to emit light. Under these circumstances, the controlled luminescent elements 50$mv$ and 50$pv$ in the adjacent rows $m$ and $p$ respectively have the edges of the depletion layers shown by dotted lines in FIG. 6B formed around the $p^+$ type control bands 34$m$ and 34$p$ and reaching both the $p^+$ type spacer blocks 46$mn$ and 46$np$ serving to prevent crosstalk. Thus the luminescence from the controlled luminescent element 50$nv$ is prevented from affecting the adjacent elements 50$nv$ and 50$pv$ so as to cause them to emit light. For the purpose of preventing the occurrence of crosstalk between the adjacent rows, the edge of the depletion layer formed around each of the $p^+$ type spacer blocks 44 due to the particular reverse voltage may be contacted by the edge of the depletion layer around the adjacent control band 34 as previously described. To this end, an electrode may be connected to each of the $p^+$ type spacer layers 72 to which is applied a reverse voltage.

It is noted that FIGS. 6B and 6C do not show the $n^+$ type semiconductor layer 30 (see, for example, FIG. 3B) and the $n^-$ type semiconductor layer forming the parts of the semiconductor 20 for spreading the edge of the depletion layer around each of the $p^+$ type control bands 34$m$, 34$n$, - - - 34$t$, but this has been omitted only for purposes simplifying the illustration.

Where the semiconductor luminescent devices are formed of gallium arsenide (GaAs) and gallium arsenidephosphide (GaAs$_{1-x}$P$_x$) as above described in conjunction with the manufacturing thereof, the device 70 emits red light through a selected one or ones of the light emitting windows 28.

As above described, the $p^+$ type control bands 34 are disposed within the $n^-$ type GaAs$_{0.6}$P$_{0.4}$ layer and the luminescent junctions 24 are formed within the $n$ type GaAs$_{0.6}$P$_{0.4}$ layer to space a luminescent region around each luminescent junction away from the associated $p^+$ type control band. Therefore the optimum impurity concentration for increasing the luminescent efficiency can be established separately from the impurity concentration required for the gate junction 36 necessary to withstand the higher voltage and for the forward current flowing between the anode and cathode electrodes due to the gate voltage to be improve in control characteristics.

When gallium phosphide (GaP) used the light emitted from the luminescent junctions may be emitted from the cathode electrode side of the element because only a relatively small proportion of the quantity of light emitted from the luminescent junctions is absorbed by the gallium phosphide. This is applicable to gallium phosphide (GaP) substrates having the GaAs$_{1-x}$P$_x$, Ga$_{1-x}$Al$_x$As or In$_{1-x}$Ga$_x$P layer grown thereon where $0 \leq x \leq 1$ and the luminescent junction is formed in that layer and also to the use of gallium arsenide (GaAs) exhibiting the luminescent phenomenon through a deep level in silicon or the like included therein as an impurity. To this end, a reticulated, light emitting window may be disposed on the cathode electrode opposite to the luminescent junctions.

In summary it is seen that the present invention provides a monolithic semiconductor luminescent display device comprising a single semiconductor substrate of one type conductivity, including a pair of opposite main faces, a plurality of discrete luminescent junctions disposed in a matrix including a first plurality of rows and a second plurality of columns within the semiconductor, a plurality of first main electrodes, one for each column disposed in ohmic contact with one of the main faces of the substrate for supplying forward currents luminescent junctions, a plurality of control semiconductor bands of the opposite type conductivity buried within the semiconductor substrate extending in the direction of the row to form pn gate junctions therebetween, a plurality of gate electrodes disposed in ohmic contact with one end of the control semiconductor bands respectively, each of the control semiconductor bands being responsive to a reverse voltage applied to the associated gate electrode to control the forward currents flowing through the luminescent junctions arranged in the mating row by a field effect on a depletion layer adjacent to the pn gate junction, a common second main electrode disposed in ohmic contact with the other main face of the substrate opposite to the first main electrodes, and a plurality of light emitting windows one for each luminescent junction disposed on one of the first and second main electrodes for passing light from the associated luminescent junctions therethrough.

The present invention has the following advantages:

(1) The gate electrode is responsive to a gate signal voltage applied thereto to continuously control forward currents flowing through the associated luminescent junctions by the field effect thereby to control the radiant outputs from those luminescent junctions while hardly any gate current is required. Therefore the gate electrode can have high input impedance and low in power loss. This results in the driving circuit for the device having a simple circuit configuration and makes it possible to form it of low capacity semiconductor elements.

(2) Because the control by the gate electrode utilizes the field effect, the radiant output has an extremely rapid response to the gate signal voltage applied to the gate electrode. Thus the display device of the present invention can not only effect the display or the transfer of information at a high speed as compared with display devices employing a liquid crystal, plasma display or like but also the device is operable at with a low voltage and can display reduced size characters and picture images. Accordingly the display device and its associated equipment can be small in size and light in weight.

(3) Either one set of the anode and cathode electrodes or the first and second main electrodes may be disposed in columns and the control semiconductor bands are buried in the direction of the rows within the semiconductor substrate. Therefore the device can have either a common cathode electrode or a common anode electrode. This eliminates the necessity of interconnecting a plurality of semiconductor luminescent diodes by connecting anode electrodes therefor to one another in the direction of the row or column and connecting cathode electrodes therefor in the direction of the column or row respectively as in conventional display devices having separate diodes connected into an intergrated circuit. This is, a complecated circuit configuration and troublesome wiring operation can be avoided.

(4) The present invention eliminates the necessity of effecting the diffusion required for electrically isolating the plurality of semiconductor diodes included in conventional monolithic semiconductor character display devices from one another. Further such conventional devices have been disadvantageous in that since the anode electrodes are interconnected in the direction of the columns or rows in the same surface and the cathode electrodes are interconnected in the direction of the rows or columns, currents from the anode electrodes flowing to the associated cathode electrodes also flow along surfaces parallel to the luminescent junctions of the diodes leading to an increase in corresponding voltage drops which leads to the anode electrodes effecting cubic crossing with respect to the cathode electrodes, so that electrical insulation is required therebetween. On the contrary, the present device has a common electrode as either the anode or cathode electrode while both electrodes are opposite to each other so that current flowing between the anode and cathode electrodes results in a low voltage drop. In addition, leads to the gate electrodes for controlling the forward current flowing through the luminescent junctions effects no cubic crossing with respect to leads to either the anode or cathode electrodes. Therefore it is possible to form the present invention into a high density integrated device circuit.

In addition, with the reticulated light emitting windows disposed on the cathode electrode as above described, the portion of the surface area of the substrate occupied by the luminescent area can be increased.

While the present invention has been described in conjunction with a few preferred embodiments thereof it is to be understood that numerous changes and modifications may be resorted to without departing from the spirit and scope of the present invention. For example, a transparent electrically conductive film formed, for example, of tin oxide may be disposed on the light emitting windows as an electrode. This ensures that the luminescent area is increased and the area with which the substrate contacts the electrode is sufficiently large.

Where the luminescent junction is formed in a semiconductive galliumarsenide (GaAs) layer, light emitted from the junction has a wavelength within a near infrared range, and can not be seen with the naked eye. Under these circumstances, any of the rare earth phosphors may be applied to the light emitting windows to convert near infrared radiation to visible radiation. Thus the resulting display can be seen with the naked eye. The use of phosphors including the oxychloride ($Y_3O\ Cl_7$) to which ytterbium ions ($Yb^{3+}$) are added is advantageous in that the color display can be effected because the resulting light is continuously changed from green to red through yellow as the exciting infrared radiation increases in intensity. Alternatively an infrared display in the form of figures, characters and/or patterns may be directly read at high speeds by infrared sensors. Examples of the infrared sensors are infrared sensitive paper, infrared sensitive film and an array of silicon photodiodes. Further it will readily be understood that more complicated pictures can be displayed as the number of the light emitting windows increases.

If desired, the semiconductor substrate and layers may have the conductivity type reversed from that illustrated with the source poled accordingly. Also the substrate may be $i$ type semiconductive material while both the control semiconductor bands and the crosstalk preventing semiconductor layers may have $n$ type conductivity.

What is claimed is:

1. A semiconductor luminescent display device comprising, in combination, a semiconductor substrate of one type conductivity including a pair of opposite main faces, a plurality of semiconductor layers of the other type conductivity discretely disposed on one of said main faces to form a plurality of luminescent junctions therebetween, said plurality of semiconductor layers being arranged in a matrix including rows and a plurality of first main electrodes each disposed in ohmic contact with all the semiconductor layers arranged in a different one of said columns, a second main electrode disposed in ohmic contact with the other main face of said semiconductor substrate to cause principal currents to flow across said luminescent junctions between said first main electrodes and the second main electrode respectively, a plurality of light passing windows disposed in a selected one of said first and second main electrodes to face said luminescent junctions to pass light from the faced luminescent junctions, a plurality of control semiconductor layers of the other type conductivity disposed within said semiconductor substrate between said semiconductor layers arranged in said matrix and said second main electrode, each of said control semiconductor layers continuously extending through said semiconductor substrate along the associated row and having a plurality of passageways for said principal currents extending therethrough to lead to the luminescent junctions arranged in said associated row, and a plurality of gate electrodes disposed in ohmic contact with said control semiconductor layers respectively, each of said gate electrodes supplying a control voltage to the mating control semiconductor layer.

2. A semiconductor luminescent display device is claimed in claim 1 wherein said semiconductor substrate has an $n$ type conductivity and both said semiconductor layers and said control semiconductor layers have a $p$ type conductivity.

3. A semiconductor luminescent display device as claimed in claim 1 wherein said semiconductor substrate is of a $p$ type semiconductive material and both said semiconductor layer and said control semiconductor layer are of an $n$ type semiconductive material.

4. A semiconductor luminescent display device as claimed in claim 1 wherein said substrate is of an $n$ type semiconductive material and both said semiconductor layer and said control semiconductor layers are of an $n$ type semiconductive material.

5. A semiconductor luminescent display devices as claimed in claim 1 wherein said semiconductor substrate is of a semiconductive material selected from the group consisting of gallium arsenide (GaAs) gallium phosphide (GaP), gallium nitride (GaN) gallium arsenidephosphide (GaAsP), gallium-aluminum-phosphide (GaAlP) and indium-gallium-phosphide (InGaP).

6. A semiconductor luminescent display device as claimed in claim 1 wherein said light passing windows are disposed in said first electrodes.

7. A semiconductor luminescent display device as claimed in claim 1 wherein said semiconductor substrate is of a selected one of gallium phosphide (GaP) and gallium arsenide (GaAs) and said light passing windows are disposed on said second main electrode.

8. A semiconductor luminescent display device as claimed in claim 1 wherein a crosstalk preventing semiconductor layer of the other type conductivity is disposed within said semiconductor substrate between each pair of adjacent rows of the matrix in which said semiconductor layers are arranged extending from said one main face of said semiconductor substrate to contact depletion layers formed around said control semiconductor layers located in said adjacent rows.

9. A semiconductor luminescent display device as claimed in claims 1 wherein a crosstalk preventing semiconductor layer of the other type conductivity is disposed within said semiconductor substrate between each pair of adjacent rows of the matrix in which said semiconductor layers are arranged so that said crosstalk preventing semiconductor layer extends from said one main face of said semiconductor substrate so as to contact depletion layers formed therearound due to a voltage at least applied thereto with depletion layers formed due to said semiconductor layers of said adjacent rows.

10. A semiconductor luminescent display device as claimed in claim 1 wherein a material for changing the wavelength of light is positioned in said light passing windows.

* * * * *